United States Patent
Fukase et al.

(10) Patent No.: US 7,775,845 B2
(45) Date of Patent: Aug. 17, 2010

(54) ORGANIC SEMICONDUCTOR DEVICE, METHOD FOR PRODUCING ORGANIC SEMICONDUCTOR DEVICE, ORGANIC ELECTROLUMINESCENT DEVICE, AND METHOD FOR PRODUCING ORGANIC ELECTROLUMINESCENT DEVICE

(75) Inventors: Akio Fukase, Chino (JP); Shunji Tomioka, Chino (JP); Hirokazu Yanagihara, Chino (JP)

(73) Assignee: Seiko Epson Corporation, Tokyo (JP)

( * ) Notice: Subject to any disclaimer, the term of this patent is extended or adjusted under 35 U.S.C. 154(b) by 491 days.

(21) Appl. No.: 11/755,172

(22) Filed: May 30, 2007

(65) Prior Publication Data
US 2008/0074037 A1    Mar. 27, 2008

(30) Foreign Application Priority Data
Jun. 28, 2006  (JP) ............................. 2006-177912

(51) Int. Cl.
*H01J 9/00* (2006.01)
(52) U.S. Cl. ....................................................... 445/23
(58) Field of Classification Search ............. 445/23–25; 313/504–506
See application file for complete search history.

(56) References Cited

U.S. PATENT DOCUMENTS 5,837,391 A * 11/1998 Utsugi ........................ 428/690
2008/0063949 A1    3/2008 Inoue

FOREIGN PATENT DOCUMENTS

| JP | A 2000-77185 | 3/2000 |
| JP | A 2000-208254 | 7/2000 |
| JP | A 2000-243300 | 9/2000 |
| WO | WO 2006/041027 A1 | 4/2006 |

* cited by examiner

*Primary Examiner*—Joseph L Williams
(74) *Attorney, Agent, or Firm*—Oliff & Berridge, PLC

(57) ABSTRACT

A method for producing an organic semiconductor device including a plurality of organic semiconductor layers laminated on a substrate includes forming a film of a liquid composition on a target surface, the liquid composition being composed of a material constituting one of the plurality of the organic semiconductor layers, the material being dissolved or dispersed in a first solvent, and the target surface including a substrate surface and a surface of any of the other of the plurality of organic semiconductor layers; altering a portion of the film adjacent to the target surface, the portion having a predetermined thickness, in such a manner that the portion is not dissolved in a predetermined solvent containing the first solvent; and removing an unaltered portion of the film in the step of altering the portion with the predetermined solvent.

11 Claims, 6 Drawing Sheets

ORGANIC SEMICONDUCTOR DEVICE, METHOD FOR PRODUCING ORGANIC SEMICONDUCTOR DEVICE, ORGANIC ELECTROLUMINESCENT DEVICE, AND METHOD FOR PRODUCING ORGANIC ELECTROLUMINESCENT DEVICE

BACKGROUND

1. Technical Field

The present invention relates to an organic semiconductor device, a method for producing an organic semiconductor device, an organic electroluminescent device, and a method for producing an organic electroluminescent device.

2. Related Art

In general, organic electroluminescent devices (hereinafter, referred to as "organic EL devices") for use in displays each include a substrate; an organic layer having a light-emitting sublayer that emits light and a hole transport sublayer that transports holes; a cathode; and an anode, the organic layer being held between the cathode and the anode, and the organic layer, the cathode, and the anode being disposed on the substrate. The light-emitting sublayer and the hole transport sublayer of the organic EL device are laminated. An electron from the cathode is combined with a hole from the anode in the light-emitting sublayer to emit light.

Examples of a method for forming the two organic sublayers, i.e., the light-emitting sublayer and the hole transport sublayer, include a method (dry process) in which materials to be formed into the light-emitting sublayer and the hole transport sublayer are sequentially deposited by evaporation on the substrate to laminate the two sublayers; and a method (wet process) in which materials to be formed into the light-emitting sublayer and the hole transport sublayer are dissolved or dispersed in an organic solvent to form liquid compositions, and after the resulting liquid compositions are applied on the substrate to form films, the organic solvent is evaporated. Examples of the wet process include ink-jet processes. Organic layers can be easily formed on large area substrates by ink-jet processes. Thus, ink-jet processes are particularly promising processes for producing, for example, organic EL devices for use in displays that have larger sizes in recent years. JP-A-2000-77185, JP-A-2000-208254, and JP-A-2000-243300 are examples of related art.

However, in the case where organic layers are formed by ink-jet processes, lyophobic or lyophilic properties of surfaces to which liquid compositions are applied are often nonuniform, thus resulting in nonuniformity in thicknesses of the formed films, in many cases. Other organic semiconductor devices such as devices including laminated organic films, e.g., organic transistors, also have the problems as well as organic EL devices.

SUMMARY

An advantage of some aspects of the invention is that an organic semiconductor device, a method for producing an organic semiconductor device is provided, an organic electroluminescent device, and a method for producing an organic electroluminescent device, each of the devices including an organic semiconductor layer having a uniform thickness.

A method according to an aspect of the invention for producing an organic semiconductor device including a plurality of organic semiconductor layers laminated on a substrate includes forming a first organic semiconductor layer including forming a film of a liquid composition on a target surface, the liquid composition being composed of a material constituting one of the plurality of the organic semiconductor layers, the material being dissolved or dispersed in a first solvent, and the target surface including a substrate surface and a surface of any of the other of the plurality of organic semiconductor layers; altering a portion of the film adjacent to the target surface, the portion having a predetermined thickness, in such a manner that the portion is not dissolved in a predetermined solvent containing the first solvent; and removing an unaltered portion of the film with the predetermined solvent, the unaltered portion being not altered in the step of altering the portion; and forming a second organic semiconductor layer on the first organic semiconductor layer formed in the step of forming the first organic semiconductor layer.

According to the aspect of the invention, the film of the liquid composition composed of the material which constitutes one of the plurality of the organic semiconductor layers and which is dissolved or dispersed in the first solvent is formed on the target surface including the substrate surface and the surface of any of the other of the plurality of organic semiconductor layers. The portion, having the predetermined thickness, of the film adjacent to the target surface is altered so as not to be dissolved in the predetermined solvent containing the first solvent. The unaltered portion of the film is removed with the predetermined solvent. Thus, the film of the altered portion having the predetermined thickness is left. The remaining portion of the film functions as the organic semiconductor layer. In this way, it is possible to form the organic semiconductor layer having a uniform thickness.

It is preferable that an electrode electrically connected to the plurality of organic semiconductor layers be formed on a surface of the substrate and the target surface be the surface of the electrode.

In this case, the electrode electrically connected to the plurality of organic semiconductor layers may be formed on the surface of the substrate, and the target surface may be the surface of the electrode. Thus, the organic semiconductor layer is formed directly on the surface of the electrode. The formation of the organic semiconductor layer directly on the surface of the electrode results in the surface contact between the organic semiconductor layer and the electrode, thereby reducing the electrical resistance between the organic semiconductor layer and the electrode to improve conductivity.

In this case, the electrode may be mainly composed of a conductive metal oxide.

The inventors found that when the organic semiconductor layer is formed on the conductive metal oxide, oxygen atoms of the metal oxide are chemically bonded to cross-linkable moieties of molecules of the organic compound contained in the organic semiconductor layer during cross-linking of the organic compound, and the cross-linked portion is not easily dissolved in the predetermined solvent. According to an embodiment of the invention, the electrode may be mainly composed of the conductive metal oxide. Thus, it is possible to further effectively prevent the organic semiconductor layer from dissolving in the predetermined solvent.

An organic semiconductor device according to an aspect of the invention may be produced by the method for producing the organic semiconductor device.

According to the aspect of the invention, it is possible to produce the high-quality organic semiconductor device including the organic semiconductor layer with a uniform thickness, the device having a uniform current density of a current flowing through the organic semiconductor layer.

A method according to another aspect of the invention for producing an organic electroluminescent device including a substrate, a cathode, an anode, and a plurality of organic layers including an organic layer having hole transport properties and an organic layer having light-emitting properties, the plurality of organic layers being disposed between the cathode and the anode, includes forming a film of a liquid composition on a target surface, the liquid composition being composed of a material constituting one of the plurality of the organic layers, the material being dissolved or dispersed in a first solvent, and the target surface including an anode surface and a surface of any of the other of the plurality of organic layers; altering a portion of the film adjacent to the target surface, the portion having a predetermined thickness, in such a manner that the portion is not dissolved in a predetermined solvent containing the first solvent; and removing an unaltered portion of the film with the predetermined solvent, the unaltered portion being not altered in the step of altering the portion.

According to the aspect of the invention, the film of the liquid composition composed of the material which constitutes one of the plurality of the organic layers and which is dissolved or dispersed in the first solvent is formed on the target surface including the anode and the surface of any of the other of the plurality of organic layers. The portion, having the predetermined thickness, of the film adjacent to the target surface is altered so as not to be dissolved in the predetermined solvent containing the first solvent. The unaltered portion of the film is removed with the predetermined solvent. Thus, the film of the altered portion having the predetermined thickness is left. The remaining portion of the film functions as the organic layer. In this way, it is possible to form the organic layer having a uniform thickness.

A method according to another aspect of the invention for producing an organic electroluminescent device including a substrate, a cathode, an anode, and a plurality of organic layers including a first organic layer having hole transport properties and a second organic layer having light-emitting properties, the plurality of organic layers being disposed between the cathode and the anode, includes forming the first organic layer including forming a first film of a liquid composition on the anode, the liquid composition being composed of a material constituting the first organic layer, the material being dissolved or dispersed in a first solvent; altering a first portion of the first film adjacent to the anode, the first portion having a predetermined thickness, in such a manner that the first portion is not dissolved in a predetermined solvent containing the first solvent; and removing an unaltered portion of the first film with the predetermined solvent, the unaltered portion being not altered in the substep of altering the first portion; and forming the second organic layer on the first organic layer.

According to the aspect of the invention, the first film of the liquid composition composed of the material which constitutes the first organic layer and which is dissolved or dispersed in the first solvent is formed on the anode. The portion, having the predetermined thickness, of the first film adjacent to the target surface is altered so as not to be dissolved in the predetermined solvent containing the first solvent. The unaltered portion of the first film is removed with the predetermined solvent to form the first organic layer. Thus, the first film of the altered portion having the predetermined thickness is left. The remaining portion of the first film functions as the first organic layer having a uniform thickness. Since the second organic layer is formed on the first organic layer having a uniform thickness, holes are uniformly injected into the second organic layer, thereby eliminating the non-uniformity of the emission of light.

In this case, the step of forming the second organic layer may include forming a second film of a liquid composition on the first organic layer, the liquid composition being composed of a material constituting the second organic layer, the material being dissolved or dispersed in the predetermined solvent; altering a second portion of the second film adjacent to the first organic layer, the second portion having a predetermined thickness, in such a manner that the second portion is not dissolved in the predetermined solvent; and removing an unaltered portion of the second film with the predetermined solvent, the unaltered portion being not altered in the substep of altering the second portion.

In this case, in the step of forming the second organic layer, the second film of the liquid composition composed of the material which constitutes the second organic layer and which is dissolved or dispersed in the predetermined solvent is formed on the anode. The portion, having the predetermined thickness, of the second film adjacent to the first organic layer is altered so as not to be dissolved in the predetermined solvent. The unaltered portion of the second film is removed with the predetermined solvent. Thus, the second film of the altered portion having the predetermined thickness is left. The remaining portion of the second film functions as the second organic layer having a uniform thickness. The second organic layer having light-emitting properties has a uniform thickness as well as the first organic layer having hole transport properties, thereby further surely eliminating non-uniformity of the emission of light.

It is preferable that the anode be mainly composed of a conductive metal oxide.

In this case, the anode may be mainly composed of the conductive metal oxide. Thus, in particular, a portion of the first film adjacent to the anode is not easily dissolved in the predetermined solvent. When the substrate and the anode transmit light, the organic electroluminescent device can be used as a bottom-emission organic electroluminescent device in which light emitted from the second organic layer emerges from the substrate through the anode.

It is preferable that the first film include a carrier transport organic compound and a cross-linkable organic compound composed of polysiloxane, and in the substep of altering the first portion, the cross-linkable organic compound contained in the first film be cross-linked by heat treatment.

In this case, the first film may include the carrier transport organic compound and the cross-linkable organic compound composed of polysiloxane. In the substep of altering the first portion, the cross-linkable organic compound contained in the first film may be cross-linked by heat treatment. Thus, a cross-linking reaction in the first film can be surely made. For example, only the portion, having the predetermined thickness, of the first film can be cross-linked by adjusting the heating temperature and heating time without cross-linking of the entirety of the first film.

It is preferable that the first film include a cross-linkable organic compound containing a silane coupling compound; and a carrier transport organic compound containing at least one selected from triphenylamine derivatives and polythiophene derivatives, and in the substep of altering the first portion, the cross-linkable organic compound contained in the first film be cross-linked by heat treatment.

In this case, a cross-linkable reaction in the portion having the predetermined thickness can be surely made. For example, only the portion, having the predetermined thickness, of the first film can be cross-linked by adjusting the heating temperature and heating time without cross-linking of the entirety of the first film.

It is preferable that the first film include a carrier transport organic compound; and a cross-linkable organic compound containing at least one group selected from double bond groups, epoxy groups, and cyclic ether groups, and in the substep of altering the first portion, the cross-linkable organic compound contained in the first film be cross-linked by heat treatment, ultraviolet irradiation, electron beam irradiation, or plasma irradiation.

In this case, the first film may include the carrier transport organic compound; and the cross-linkable organic compound containing at least one group selected from double bond groups, epoxy groups, and cyclic ether groups. In the substep of altering the first portion, the cross-linkable organic compound contained in the first film may be cross-linked by heat treatment, ultraviolet irradiation, electron beam irradiation, or plasma irradiation. Thus, a cross-linking reaction in the portion having the predetermined thickness can be surely made. For example, only the portion, having the predetermined thickness, of the first film can be cross-linked by adjusting the heating temperature and heating time for heat treatment or by adjusting the intensity and irradiation time for ultraviolet irradiation, electron beam irradiation, and plasma irradiation, without cross-linking of the entirety of the first film.

In particular, in the case where cross-linking is made by irradiating the cross-linkable organic compound with ultraviolet rays, different amounts of ultraviolet irradiation in response to positions of the first films can be set using a photomask having portions with different ultraviolet transmittances. A larger amount of ultraviolet irradiation results in a larger thickness of the altered portion of the first film. Therefore, the different amounts of ultraviolet irradiation result in different thicknesses of the altered portions of the first films in the step of altering the first portion, thus leading to different first organic layers. For example, in the case where an organic electroluminescent device has a plurality of pixel regions and emits light beams having different wavelengths (colors) such as red, green, and blue, an optimum amount of hole injected is different in each color. In this case, thicknesses of the first organic layers are changed from color to color; hence, optimum amounts of holes can be injected. In this way, the possibility of design of the organic electroluminescent device is advantageously expanded.

It is preferable that the second film include a light-emitting organic compound; and a cross-linkable organic compound containing at least one group selected from double bond groups, epoxy groups, and cyclic ether groups, and in the substep of altering the second portion, the cross-linkable organic compound contained in the second film be crosslinked by heat treatment, ultraviolet irradiation, electron beam irradiation, or plasma irradiation, In this case, a material constituting the second organic layer may contain the light-emitting organic compound and the cross-linkable organic compound containing at least one group selected from double bond groups, epoxy groups, and cyclic ether groups. In the substep of altering the second portion, the cross-linkable organic compound contained in the second film may be cross-linked by heat treatment, ultraviolet irradiation, electron beam irradiation, or plasma irradiation. Thus, a cross-linking reaction in the portion having the predetermined thickness can be surely made. For example, only the portion, having the predetermined thickness, of the second film can be cross-linked by adjusting the heating temperature and heating time for heat treatment or by adjusting the intensity and irradiation time for ultraviolet irradiation, electron beam irradiation, and plasma irradiation, without cross-linking of the entirety of the second film.

In particular, in the case where cross-linking is made by irradiating the cross-linkable organic compound with ultraviolet rays, different amounts of ultraviolet irradiation in response to positions of the second films can be set using a photomask having portions with different ultraviolet transmittances. As described above, the different amounts of ultraviolet irradiation result in different thicknesses of the altered portions of the second films in the step of altering the second portion, thereby leading to different thicknesses of the second layers. For example, in the case where an organic electroluminescent device has a plurality of pixel regions and emits light beams having different wavelengths (colors) such as red, green, and blue, optimum brightness and light intensity are different in each color. In this case, thicknesses of the second organic layers are changed from color to color in such a manner that light optimum brightness and light intensity can be provided. In this way, the possibility of design of the organic electroluminescent device is advantageously expanded.

An organic electroluminescent device according to an aspect of the invention includes a substrate; an anode disposed on a surface of the substrate; an insulating layer disposed on the substrate in such a manner that the anode is covered with the insulating layer, the insulating layer having a first opening superposed on the anode in a plan view, and the first opening partially exposing the anode; a hole transport layer disposed on the anode in such a manner that a portion having hole transport properties is located within the first opening; a light-emitting layer disposed on the hole transport layer; a bank disposed on the insulating layer and having a second opening superposed on the first opening in a plan view; and a cathode disposed in such a manner that the bank is covered with the cathode, the cathode being electrically connected to the light-emitting layer.

The organic electroluminescent device according to the aspect of the invention has a structure that is characteristic when the organic electroluminescent device is produced through the above-described production process. In the production process, the unaltered portion of the first film is removed to form the first organic layer (hole transport layer), thereby reducing the thickness of the resulting hole transport layer. The reduction in thickness eliminates the formation of a portion having hole transport properties in the opening (second opening) of the bank. In other words, the entirety of the portion having hole transport properties is located within the opening (first opening) of the insulating layer.

In particular, in the case where the area of the opening of the bank is larger than that of the opening of the insulating layer, when droplets are applied by a droplet ejecting method, the droplets are applied into not only the opening of the insulating layer but also the opening of the bank. Thus, the top surface of the insulating layer is often covered with the droplets. When the hole transport layer is formed while the top surface of the insulating layer is covered with the droplets, holes from the anode are also fed into a portion formed on the top surface of the insulating layer.

When the hole transport layer is formed on the top surface of the insulating layer, the light-emitting layer, which is located on the hole transport layer, is also formed above the top surface of the insulating layer. Holes are also injected into a portion of the light-emitting layer located above the top surface of the insulating layer; hence, this portion also emits light. In the organic electroluminescent device, a preferred light-emitting region is a region (region of the first opening) at which the anode is exposed. When holes are injected into the portion formed above the top surface of the insulating layer, light also emerges from a region outside the first opening. That is, light emerges from a region larger than the first opening, thereby degrading display accuracy.

According to the aspect of the invention, the portion having hole transport properties of the hole transport layer is located within the first opening, thereby preventing the emission of light at the outside of the first opening. This provides the organic electroluminescent device having high display accuracy.

It is preferable that the light-emitting layer be located within the first opening.

In this case, the light-emitting portion of the light-emitting layer is located within the first opening as well as the portion having hole transport properties of the hole transport layer. In the above-described production process, the unaltered portion of the second film is removed to form the second organic layer (light-emitting layer); hence, the thickness of the resulting light-emitting layer is also reduced. In this case, the light-emitting portion of the light-emitting layer is also located within the first opening, thereby further surely preventing the emission of light at the outside of the region of the first opening.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A first embodiment of the invention will be described below on the basis of the drawings.

Organic EL Device

Figure 1:
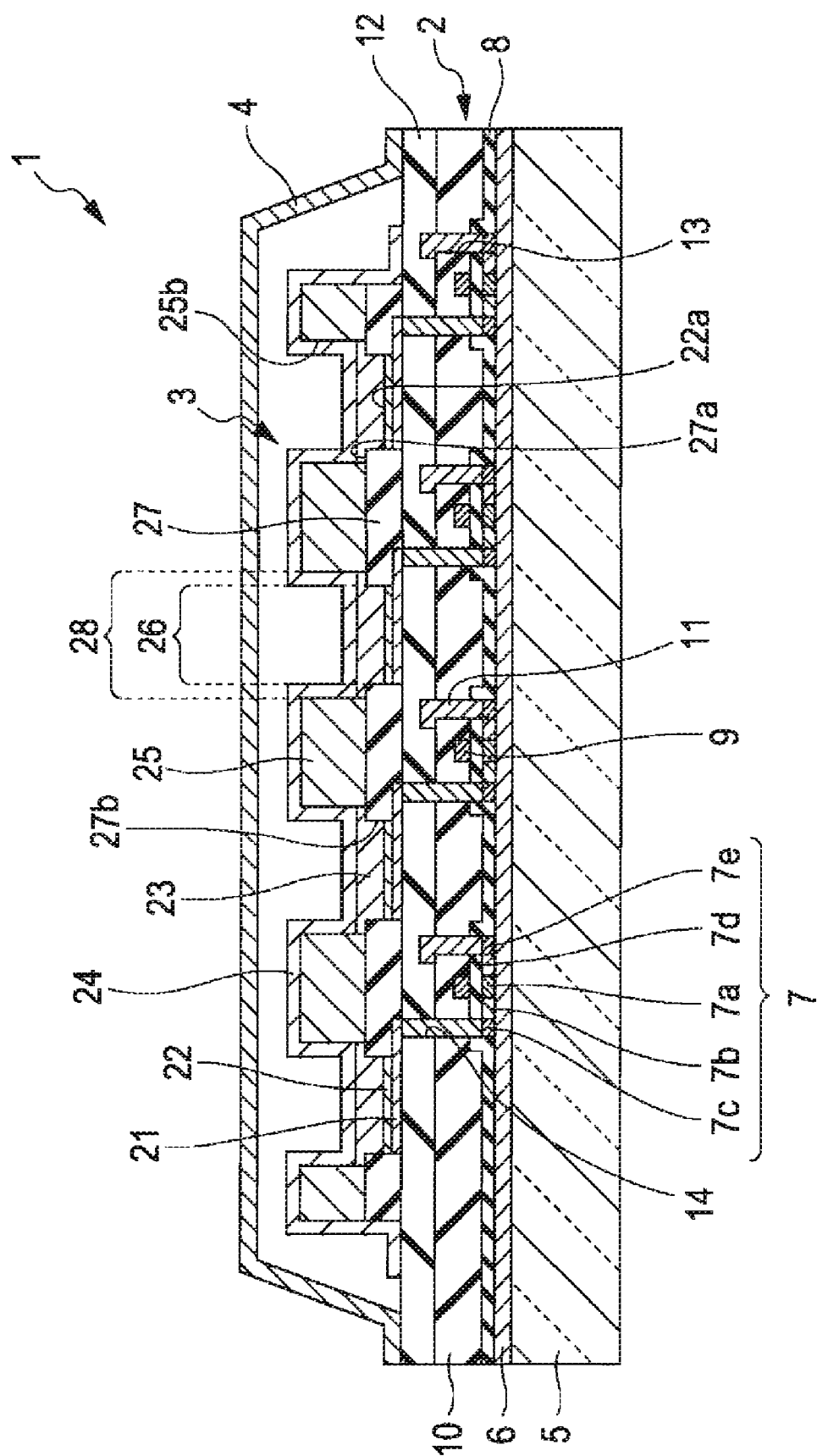
FIG. 1 is a cross-sectional view of the overall structure of an organic EL device according to a first embodiment of the invention.

FIG. 1 is a schematic cross-sectional view of an organic EL device 1. Components are shown at different scales so as to be recognizable in the drawings. The organic EL device 1 according to this embodiment is an active-matrix organic EL device including a thin-film transistor as a switching element.

The organic EL device 1 mainly includes an element substrate 2, organic EL layers 3, and a protective layer 4. In the organic EL device 1, the organic EL layers 3 are formed on the element substrate 2, and the organic EL layers 3 are covered with the protective layer 4. In this embodiment, a bottom-emission organic EL device, in which light emitted from each organic EL layer 3 travels toward the element substrate 2, is exemplified.

The element substrate 2 includes a substrate 5, a surface layer 6, semiconductor layers 7, a gate insulating layer 8, gate electrodes 9, a first insulating layer 10, source electrodes 11, and a second insulating layer 12.

The substrate 5 is rectangular and composed of a light-transmitting material such as glass or quartz. The surface layer 6 is formed on the substrate 5 and is an insulating layer composed of, for example, silicon oxide or silicon nitride.

Each of the semiconductor layers 7 is composed of, for example, amorphous silicon and is divided into five regions. A channel region 7a is located in the middle of the semiconductor layer 7 in the horizontal direction in the figure. On the source side (the left side in the figure) with reference to the channel region 7a, a lightly doped source region 7b is located at the left side of the channel region 7a in the figure, and a heavily doped source region 7c is located on the left side of the lightly doped source region 7b in the figure. On the drain side (the right side of the figure) of the channel region 7a, a lightly doped drain region 7d is located at the right side of the channel region 7a in the figure, and a heavily doped drain region 7e is located at the right side of the lightly doped drain region 7d in the figure.

The surface layer 6 and the semiconductor layer 7 are covered with the gate insulating layer 8.

Each of the gate electrodes 9 is formed on the gate insulating layer 8. The gate electrode 9 is located so as to be superposed on the channel region 7a of the semiconductor layer 7 in a plan view. For example, the gate electrode 9 has a multilayer structure (not shown) in which three metal layers are laminated. The lower layer (located directly on the gate insulating layer 8) is composed of titanium nitride. The middle layer is composed of a mixture of aluminum and copper. The upper layer is composed of titanium.

The semiconductor layers 7, the gate insulating layer 8, and the gate electrodes 9 constitute thin film transistors (TFTs) as switching elements of the organic EL device 1.

The first insulating layer 10 is composed of, for example, silicon oxide or silicon nitride. The gate insulating layer 8 and the gate electrodes 9 are covered with the first insulating layer 10.

The source electrodes 11 are formed on the first insulating layer 10. Each of the source electrodes 11 is connected to the heavily doped source region 7c of the semiconductor layers 7 via a contact hole 13 passing through the first insulating layer 10 and the gate insulating layer 8. Each of the source electrodes 11 is a single layer composed of a metal. Alternatively, the source electrode 11 has a multilayer structure constituted by laminated metal layers similar to the gate electrodes 9. For example, in the case where three metal layers are laminated, the lower layer (located directly on the first insulating layer 10) is composed of titanium or titanium nitride. The middle layer is composed of a mixture of aluminum and copper. The upper layer is composed of titanium.

The second insulating layer 12 is composed of, for example, silicon oxide or silicon nitride. The first insulating layer 10 and the source electrodes 11 are covered with the second insulating layer 12.

The organic EL layers 3 are formed on the second insulating layer 12 on the element substrate 2. Each of the organic EL layers 3 mainly includes an anode 21, a hole transport sublayer (first organic sublayer) 22, a light-emitting sublayer (second organic sublayer) 23, a cathode 24, a bank 25, an insulating sublayer 27.

Each of the anodes 21 is formed directly on the second insulating layer 12 of the element substrate 2 and is in the form of a thin film. The anode 21 is composed of a light-transmitting metal oxide having conductivity, for example, indium tin oxide (ITO) or indium zinc oxide (IZO). The anode 21 is connected to the heavily doped drain region 7e via a contact hole 14 passing through three insulating layers: the second insulating layer 12, the first insulating layer 10, and gate insulating layer 8.

The insulating sublayer 27 is composed of an insulating material such as silicon nitride. The insulating sublayer 27 is formed on a surface of the second insulating layer 12 on the element substrate 2 and the anode 21. The insulating sublayer 27 has openings 26 arrayed in a matrix in a plan view. Each of the openings 26 is formed so as to partially expose the anode 21.

The hole transport sublayer 22 injects a hole from the anode 21 into the light-emitting sublayer 23 and is formed on the anode 21. Each of the hole transport sublayers 22 is formed so as to be completely accommodated in a corresponding one of the openings 26. The position in height (height from the second insulating layer 12) of the top surface 22a of the hole transport sublayer 22 is lower than the position in height of the top surface 27a of the insulating sublayer 27. The top surface 22a is flat.

The hole transport sublayer 22 is composed of a carrier transport organic compound and a cross-linkable organic compound. Examples of the carrier transport organic compound include known electron transport organic compounds; and functional group-containing electron transport organic compounds, such as 2,5-bis(1-naphthyl)-1,3,4-oxadiazole (BND), 2-(4-tert-butylphenyl)-5-(4-biphenylyl)-1,3,4-oxadiazole, 2,5-bis[1-(2-oxapentenyl)naphthyl]-1,3,4-oxadiazole, and 2-(4-(2-oxa-4-pentenyl)phenyl)-5-(1-naphthyl)-1,3,4-oxadiazole. Examples of the cross-linkable organic compound usable include polysiloxanes, such as polymethylhydrogensilicone and polyphenylhydrogensilicone, and copolymers thereof.

In addition, for example, a combination of a triphenylamine derivative such as poly{(9,9-dioctylfluorene-2,7-diyl)-alt-[N,N'-bis(4-tert-butylphenyl)-N,N'-diphenylbenzidine-4',4''-diyl]} (hereinafter, referred to as "PF8-TPD") of chemical formula 1:

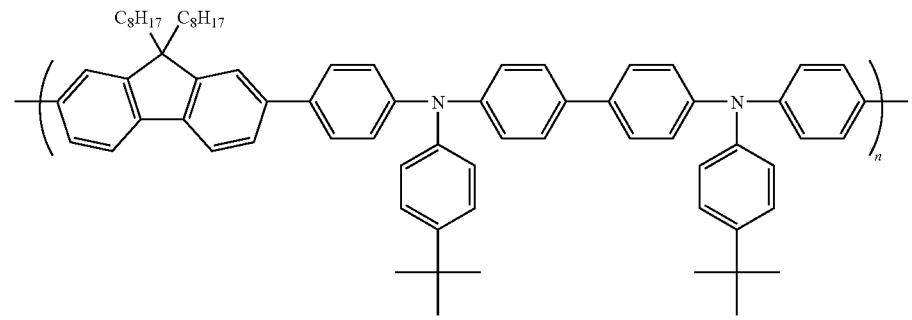

or a polythiophene derivative and a silane coupling cross-linker such as γ-glycidyloxypropyltrimethoxysilane of chemical formula 2:

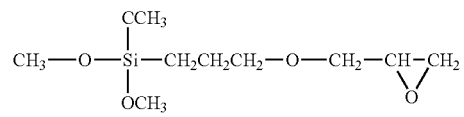

may be used as the carrier transport organic compound.

Furthermore, a low-molecular-weight cross-linker having a double-bond group, an epoxy group, or a cyclic ether group may be used as the carrier transport organic compound. Preferred examples of the low-molecular-weight cross-linker usable include cross-linkers that are cross-linkable when irradiated with ultraviolet rays, electron beams, plasmas, and heating. The low-molecular-weight cross-linker preferably has a molecular weight of 5,000 or less, more preferably 15 to 3,000, and particularly preferably 50 to 1,000. The low-molecular-weight cross-linker used in embodiments of the invention preferably has at least two functional groups. For example, the low-molecular-weight cross-linker according to embodiments of the invention having a structure selected from structures represented by chemical formulae 3:

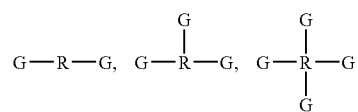

is used, wherein Gs each represent a functional group, and Rs each represent a molecular skeleton.

In addition, a single functional group-containing cross-linker of chemical formula 4:

R-G may be contained.

Examples of the molecular skeleton R include skeletons of chemical formulae 5 and 6:

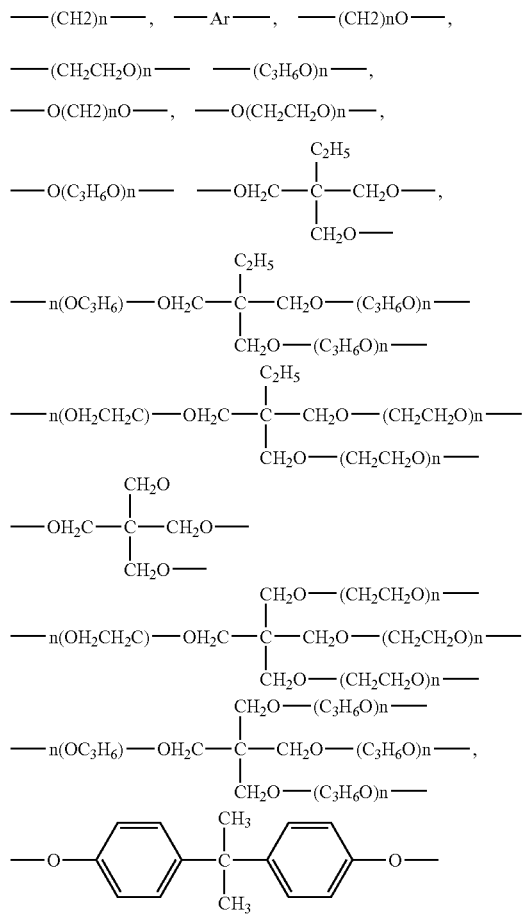

In the case of the cross-linker having a single functional group, preferred examples of R include hydrogen; alkyl, alkoxy, alkylthio, alkylsilyl, alkylamino, aryl, aryloxy, arylalkyl, arylalkoxy, arylalkenyl, arylalkynyl, and arylamino groups; and heterocyclic compound moieties.

Examples of the functional group G include double-bond groups, epoxy groups, and cyclic ether groups. Examples of the double-bond group include vinyl, acrylate, and methacrylate groups. The epoxy group may be a glycidyl group. An example of the cyclic ether is an oxetane group. Thus, the functional group G having a structure selected from structures represented by chemical formulae 7:

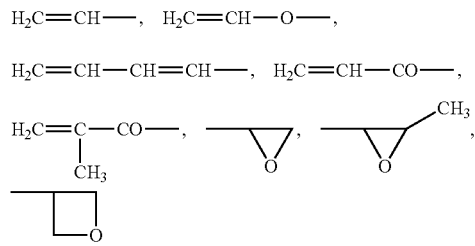

may be used.

Examples of the low-molecular-weight cross-linker according to embodiments of the invention include divinylbenzene, acrylates, methacrylates, vinyl acetate, acrylonitrile, acrylamide, ethylene glycol diacrylate, ethylene glycol dimethacrylate, ethylene glycol divinyl ether, ethylene glycol diglycidyl ether, ethylene glycol dicyclopentenyl ether methacrylate, 1,3-butanediol diacrylate, 1,4-butanediol diacrylate, 1,4-butanediol diglycidyl ether, 1,3-butanediol dimethacrylate, 1,4-butanediol dimethacrylate, 1,4-butanediol divinyl ether, 1,6-hexanediol diacrylate, 1,6-hexanediol dimethacrylate, 1,6-hexanediol divinyl ether, 1,6-hexanediol ethoxylate diacrylate, 1,6-hexanediol propoxylate diacrylate, trimethylolpropane triacrylate, trimethylolpropane triglycidyl ether, trimethylolpropane trimethacrylate, trimethylolpropane ethoxylate methyl ether diacrylate, trimethylolpropane ethoxylate triacrylate, trimethylolpropane propoxylate triacrylate, pentaerythritol tetraacrylate, pentaerythritol tetramethacrylate, bisphenol A diacrylate, bisphenol A dimethacrylate, bisphenol A ethoxylate diacrylate, bisphenol A ethoxylate dimethacrylate, bisphenol A propoxylate diacrylate, bisphenol A propoxylate diglycidyl ether, and bisphenol A dimethacrylate.

The light-emitting sublayer 23 emits light through the combination of holes from the hole transport sublayer 22 and electrons from the cathode 24. The light-emitting sublayer 23 is formed on the hole transport sublayer 22.

The light-emitting sublayer 23 is composed of a luminescent organic compound. Examples of the luminescent organic compound suitably used include fluorene derivatives, polyfluorene derivatives, p-phenylene vinylene derivatives, poly (p-phenylene vinylene) derivatives, polyphenylene (PP) derivatives, poly-p-phenylene (PPP) derivatives, polyvinyl carbazole (PVK), polythiophene derivatives, and polysilanes, such as polymethylphenylsilane (PMPS). These polymeric materials may be doped with a polymeric material, such as a perylene pigment, a coumalin pigment, or a rhodamine pigment; or a low-molecular-weight material, such as rubrene, perylene, 9,10-diphenylanthracene, tetraphenylbutadiene, Nile red, coumalin 6, or quinacridone.

The cathode 24 is composed of a metal, such as aluminum or silver, having high conductivity and reflectance. The cathode 24 injects electrons into the light-emitting sublayer 23. The cathode 24 also serves as a reflector that reflects light emitted from the light-emitting sublayer 23 toward the substrate 5 (underside of the figure). The cathode 24 is formed on the entire surface of the organic EL layers 3 including the insulating sublayer 27, the bank 25, and the light-emitting sublayers 23.

Method for Producing Organic EL Device

A method for producing the organic EL device 1 having the above-described structure will be described below.

The surface layer 6, the semiconductor layers 7, the gate insulating layer 8, and the gate electrodes 9 are formed in that order on the substrate 5. The first insulating layer 10, the contact holes 13, the source electrodes 11, the second insulating layer 12, and the contact holes 14 are formed. The anodes 21 are formed so as to overlap the contact holes 14. After patterning, the bank 25 is formed.

The hole transport sublayers 22 are formed at places surrounded by the bank 25. This step will be specifically described below.

A liquid composition composed of a carrier transport material, such as PF8-TPD, and a cross-linkable material, such as γ-glycidyloxypropyltrimethoxysilane, dissolved in an organic solvent is prepared in advance. Examples of the organic solvent usable include isopropyl alcohol (IPA), n-butanol, γ-butyrolactone, N-methylpyrrolidone (NMP), 1,3-dimethyl-2-imidazolidinone (DMI), and derivatives thereof; and glycol ethers, such as Carbitol acetate and butylcarbitol acetate.

Figure 2:
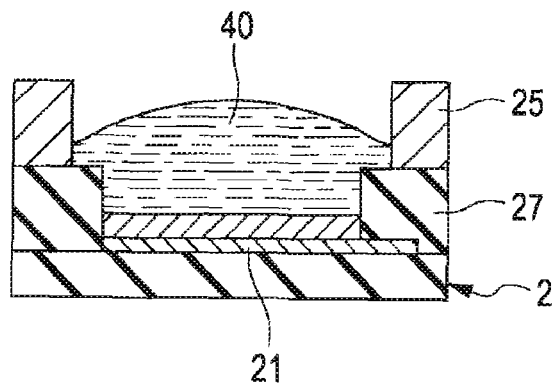
FIG. 2 is a process drawing illustrating a process of producing the organic EL device according to the first embodiment.

As shown in FIG. 2, the liquid composition is ejected by an ink-jet method onto each anode 21 surrounded by the bank 25 to form films 40. The resulting films 40 are dried.

Figure 3:
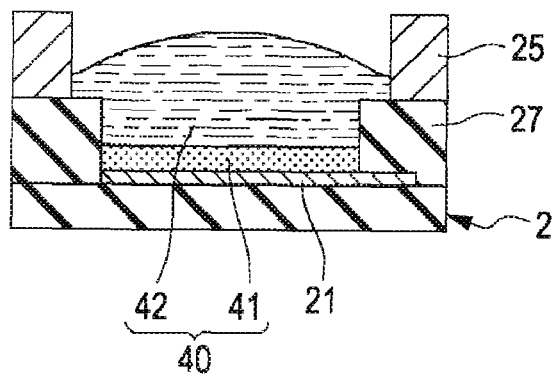
FIG. 3 is a process drawing illustrating the process of producing the organic EL device according to the first embodiment.

After the formation of the films 40, the substrate 5 is placed in vacuum for about 30 minutes to dry the films 40. Then the films 40 are heated on a hot plate in a nitrogen atmosphere at about 150° C. for about 10 minutes. As shown in FIG. 3, a portion of each film 40 adjacent to a corresponding one of the anodes 21 undergoes cross-linking and curing by heating, the portion having a predetermined thickness. In the cured portion 41, oxygen atoms of the metal oxide constituting the anode 21 are chemically bonded to cross-linkable moieties during cross-linking of the organic compound. The cured portion is not dissolved in an organic solvent. The surface side of the film 40 (uncured portion 42) is not cured by heating. The uncured portion 42 can still be dissolved in an organic solvent.

Figure 4:
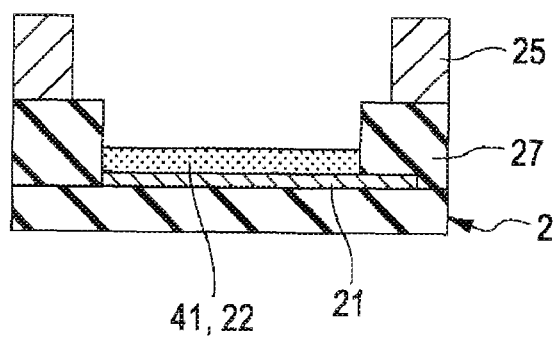
FIG. 4 is a process drawing illustrating the process of producing the organic EL device according to the first embodiment.

After the substrate 5 is heated, as shown in FIG. 4, the uncured portion 42 of the film 40 is removed. For example, a rinse liquid composed of an organic material such as toluene is dispensed on the substrate 5. The rinse liquid is extended on the entire surface of the substrate 5 by spin coating, thereby washing away the uncured portion 42. In this case, for example, the substrate 5 is rotated at about 2,000 rpm for about 30 seconds. Since the cured portion 41 of the film 40 is not dissolved in an organic solvent, only the uncured portion 42 is washed away. The cured portion 41 is left on the substrate 5. Then the surface of the substrate 5 is dried. The remaining cured portion 41 functions as the hole transport sublayer 22.

Figure 5:
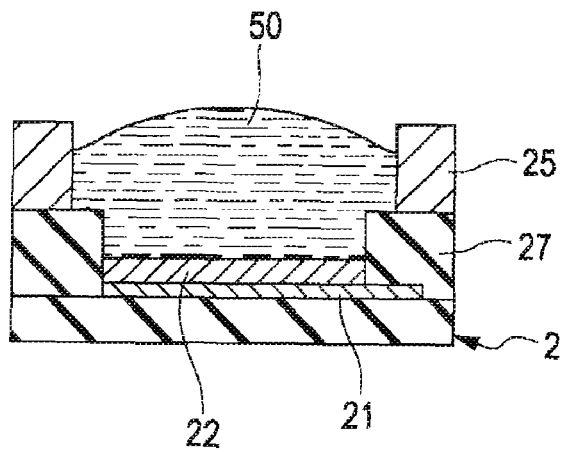
FIG. 5 is a process drawing illustrating the process of producing the organic EL device according to the first embodiment.
Figure 6:
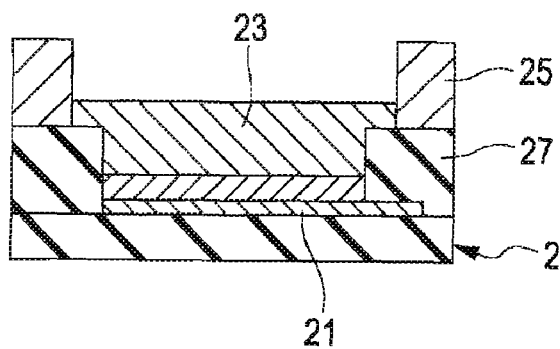
FIG. 6 is a process drawing illustrating the process of producing the organic EL device according to the first embodiment.

The light-emitting sublayers 23 are formed at a place surrounded by the bank 25. A liquid composition composed of the luminescent material dissolved in the organic solvent is prepared in advance. As shown in FIG. 5, the liquid composition is ejected by an ink-jet method onto each hole transport sublayer 22 surrounded by the bank 25 to form a film 50. The hole transport sublayer 22 is the cured portion 41 and is not dissolved in an organic solvent. Thus, the organic solvent does not dissolve the hole transport sublayer 22. The film 50 formed by ejection is heated and dried to form the light-emitting sublayer 23.

After the formation of the light-emitting sublayers 23, the cathode 24 is formed on the entirety of surfaces of EL elements to form the organic EL layers 3. Then a resin seal and the protective layer 4 are formed in such a manner that the organic EL layers 3 are covered with the resin seal and the protective layer 4 to complete the organic EL device 1.

According to this embodiment, each of the films 40 of the liquid composition composed of the material which constitutes the hole transport sublayers 22 and which is dissolved or dispersed in the organic solvent is formed on a corresponding one of the anodes 21. The portion of each film 40 adjacent to a target surface, the portion having a predetermined thickness, is cured so as not to be dissolved in the predetermined solvent containing the organic solvent, thereby forming the cured portion 41. The uncured portion 42 of each film 40 is removed with toluene or the like to form a corresponding one of the hole transport sublayers 22. As a result, the cured portion 41 is left and serves as the hole transport sublayer 22 having a uniform thickness. Each of the light-emitting sublayers 23 is formed on a corresponding one of the hole transport sublayers 22 each having a uniform thickness; hence, holes are uniformly injected into each light-emitting sublayer 23. Thereby, the non-uniformity of the emission of light can be eliminated.

The organic EL device 1 according to this embodiment has a structure that is characteristic when the organic EL device 1 is produced through the production process. In the production process, the uncured portion 42 of each film 40 is removed to form the hole transport sublayer 22, thereby reducing the thickness of the resulting hole transport sublayer 22. The reduction in thickness eliminates the formation of a portion having hole transport properties in an opening 28 of the bank 25. In other words, the entirety of the portion having hole transport, properties is located within a corresponding one of the openings 26 of the insulating sublayer 27.

In the organic EL device 1, the area of each opening of the bank 25 is larger than that of each opening 26 of the insulating sublayer 27. In the case of the application of droplets ejected by a droplet ejecting method, the droplets are applied into not only each opening 26 of the insulating sublayer 27 but also each opening 28 of the bank 25. Thus, the top surface 27a of the insulating sublayer 27 is covered with the droplets. When the hole transport sublayer 22 is formed while the top surface 27a of the insulating sublayer 27 is covered with the droplets, holes from the anode 21 are also fed into a portion formed on the top surface 27a of the insulating sublayer 27.

When the hole transport sublayer 22 is formed on the top surface 27a of the insulating sublayer 27, the light-emitting sublayer 23, which is located on the hole transport sublayer 22, is also formed above the top surface 27a of the insulating sublayer 27. Holes are also injected into a portion of the light-emitting sublayer 23 located above the top surface 27a of the insulating sublayer 27; hence, this portion also emits light. In the organic EL device 1, preferred light-emitting regions are each a region (region of the opening 26) at which a corresponding one of the anodes 21 is exposed. When holes are injected into the portion formed above the top surface 27a of the insulating sublayer 27, light also emerges from a region outside each opening 26. That is, light emerges from a region larger than the opening 26 (first opening), thereby degrading display accuracy.

According to this embodiment, each hole transport sublayer 22 is located within a corresponding one of the openings 26, thereby preventing the emission of light at the outside of the opening 26. This provides the organic EL device 1 having high display accuracy.

Second Embodiment

Figure 8:
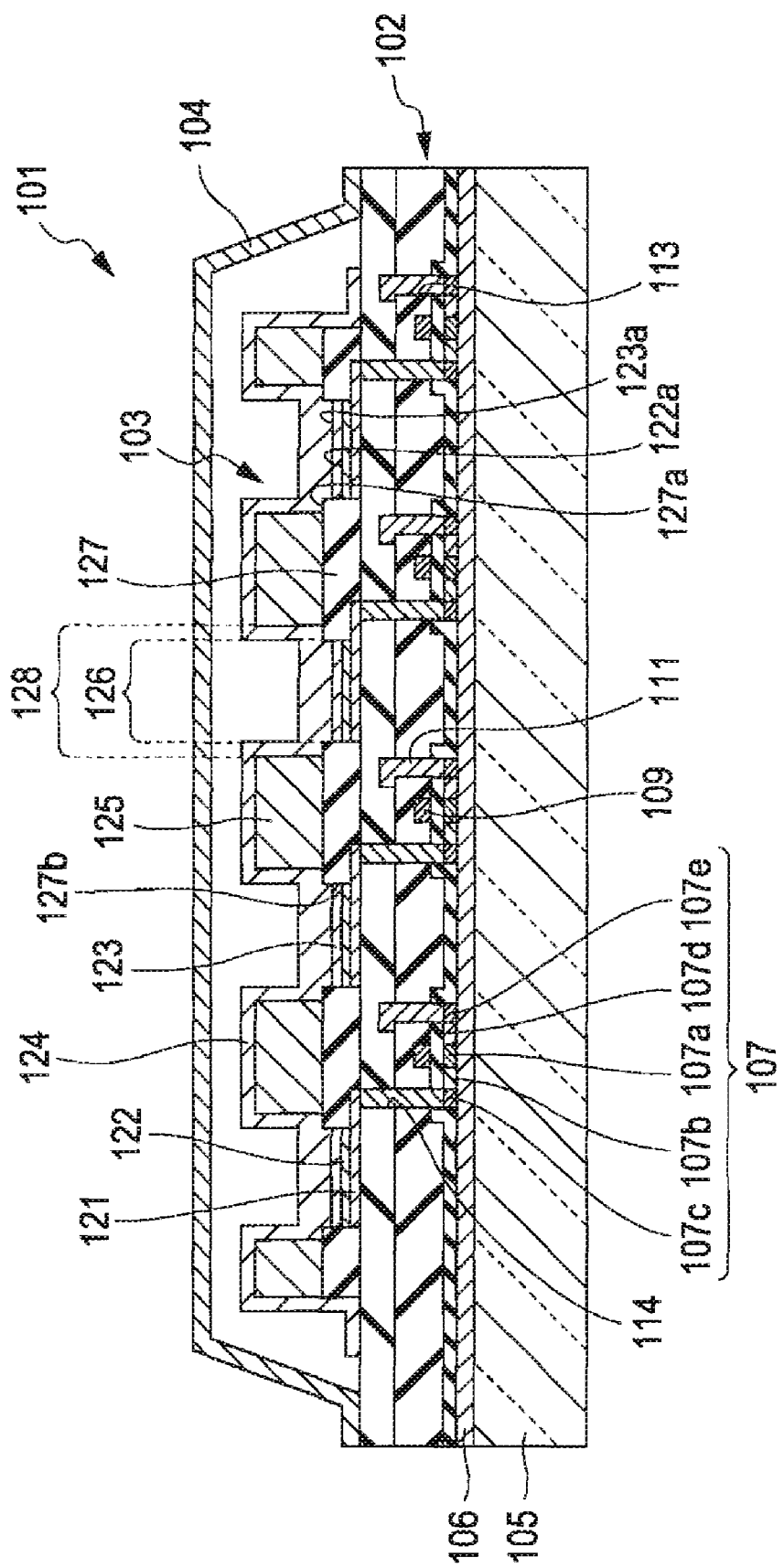
FIG. 8 is a cross-sectional view of the overall structure of an organic EL device according to a second embodiment of the invention.

A second embodiment of the invention will be described below. Components are shown at different scales so as to be recognizable in the drawings in the same way as in the first embodiment. Description of the same elements as in the first embodiment is omitted. In this embodiment, the structure of light-emitting sublayers of an organic EL device and steps subsequent to a step of forming a hole transport sublayer in a process of producing the organic EL device are different from those in the first embodiment. Thus, these points will be mainly described, FIG. 8 is a cross-sectional view of the structure of an organic EL device 101 according to this embodiment. The structure is the same as in the first embodiment except for light-emitting sublayers 123; hence, redundant description is not repeated.

The light-emitting sublayers 123 are formed in openings 126 of an insulating sublayer 127 and are laminated on hole transport sublayers 122. Each of the light-emitting sublayers 123 may be composed of an appropriate combination of the luminescent organic compound and the cross-linkable organic compound described in the first embodiment. The position in height (height from the second insulating layer 112) of the top surface 123a of the light-emitting sublayer 123 is lower than the position in height of the top surface 127a of the insulating sublayer 127. The top surface 123a is flat. That is, in this embodiment, each of the light-emitting sublayers 123 is formed so as to be completely accommodated in a corresponding one of the openings 126 of the insulating sublayer 127 as well as the hole transport sublayer 122.

Figure 9:
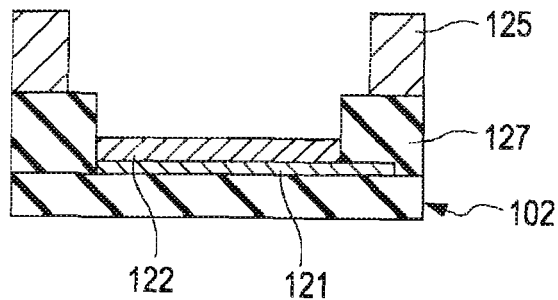
FIG. 9 is a process drawing illustrating a process of producing the organic EL device according to the second embodiment.

A process of producing the organic EL device 101 having the above-described structure will be described below. In this embodiment, the process is the same as in the first embodiment until the hole transport sublayers 122 are formed (state shown in FIG. 9). Thus, the description is omitted. Steps subsequent to the step of forming the hole transport sublayers 122 will be mainly described.

Figure 10:
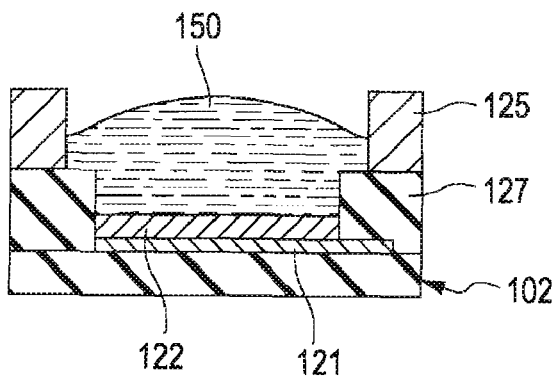
FIG. 10 is a process drawing illustrating the process of producing the organic EL device according to the second embodiment.

A liquid composition composed of a luminescent material dissolved in an organic solvent is prepared in advance. The luminescent material and the organic solvent that are similar to those used in the first embodiment are used. As shown in FIG. 10, the liquid composition is ejected by an ink-jet method on the hole transport sublayers 122 surrounded by a bank 125 to form films 150.

Figure 11:
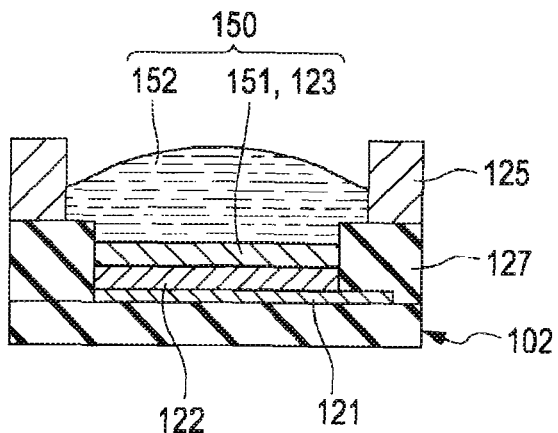
FIG. 11 is a process drawing illustrating the process of producing the organic EL device according to the second embodiment.

After the formation of the films 150, a substrate 102 is placed in vacuum for about 30 minutes to dry the films 150. Then the films 150 are heated on a hot plate in a nitrogen atmosphere at about 150° C. for about 10 minutes. As shown in FIG. 11, a portion of each film 150 adjacent to a corresponding one of the hole transport sublayers 122 undergoes cross-linking and curing by heating, the portion having a predetermined thickness. A cured portion 151 is not dissolved in an organic solvent. The surface side of the film 150 (uncured portion 152) is not cured by heating. The uncured portion 152 can still be dissolved in an organic solvent.

Figure 12:
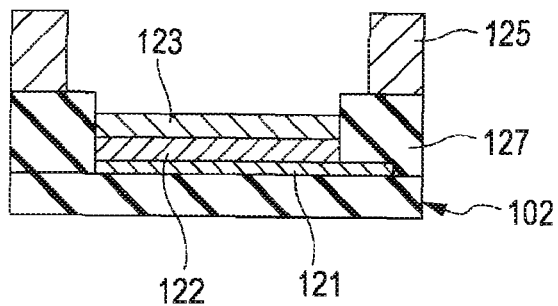
FIG. 12 is a process drawing illustrating the process of producing the organic EL device according to the second embodiment.

After the substrate 102 is heated, as shown in FIG. 12, the uncured portion 152 of the film 150 is removed. For example, a rinse liquid composed of an organic material such as toluene is dispensed on the substrate 102 in the same way as in the case of the formation of the hole transport sublayer 122. The rinse liquid is extended on the entire surface of the substrate 102 by spin coating, thereby washing away the uncured portion 152. The number of revolutions and the time of revolution of the substrate 102 are the same as in the case of the formation of the hole transport sublayer 122. Since the cured portion 151 of the film 150, is not dissolved in an organic solvent, only the uncured portion 152 is washed away. The cured portion 151 is left on the hole transport sublayer 122. Then the surface of the substrate 102 is dried. The remaining cured portion 151 functions as the light-emitting sublayer 123. Then, the organic EL device 101 is completed through the same steps as in the first embodiment.

According to this embodiment, in the case of the formation of light-emitting sublayers 123, each of the films 150 of the liquid composition composed of the material which constitutes the light-emitting sublayers 123 and which is dissolved or dispersed in the organic solvent is formed on a corresponding one of the hole transport sublayers 122. The portion of each film 150 adjacent to the hole transport sublayer 122, the portion having a predetermined thickness, is cured so as not to be dissolved in a solvent such as toluene. The uncured portion 152 of each film 150 is removed with a solvent such as toluene. The cured portion 151 is left and serves as the light-emitting sublayer 123 having a uniform thickness. The light-emitting sublayers 123 each have a uniform thickness as well as the hole transport sublayers 122; hence, the organic EL device 101 having the markedly high uniformity of the emission of light can be produced.

Furthermore, according to this embodiment, both of the hole transport sublayer 122 and the light-emitting sublayer 123 are located within the opening 126. That is, the light-emitting sublayer 123 is not located outside of the opening 126, thereby preventing an increase in the area of a light-emitting region and preventing a reduction in display accuracy.

Third Embodiment

A third embodiment of the invention will be described below. Components are shown at different scales so as to be recognizable in the drawings in the same way as in the first embodiment. Description of the same elements as in the first embodiment is omitted. In this embodiment, structures of hole transport sublayers and light-emitting sublayers of an organic EL device and methods for forming the hole transport sublayers and the light-emitting sublayers in a process of producing the organic EL device are different from those in the first embodiment. Thus, these points will be mainly described.

Figure 13:
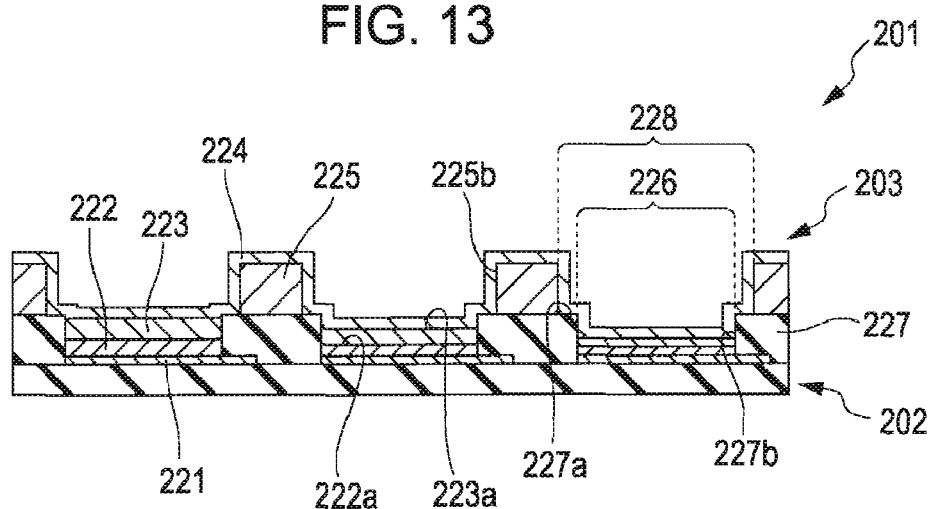
FIG. 13 is a process drawing illustrating the process of producing the organic EL device according to the second embodiment.

FIG. 13 is a cross-sectional view of an organic EL device 201 according to the embodiment.

In this embodiment, hole transport sublayers 222 and light-emitting sublayers 223 are formed on anodes 221. Each hole transport sublayer 222 and each light-emitting sublayer 223 are formed so as to be completely accommodated in an opening 226 of an insulating sublayer 227. The thickness of each hole transport sublayer 222 and the thickness of each light-emitting sublayer 223 varies from pixel to pixel. A cathode 224 is formed on the entire surface of a bank 225 and formed on part of the insulating sublayers 227. The cathode 224 is also located in the openings 226 of the insulating sublayer 227. In each opening 226, the cathode 224 is in contact with the entirety of the top surface 223a of each light-emitting sublayer 223. In FIG. 13, the thickness of one hole transport sublayer 222 is smaller than that of the other hole transport sublayer 222 located to the left of the one hole transport sublayer 222, and the thickness of one light-emitting sublayer 223 is smaller than that of the other light-emitting sublayer 223 located to the left of the one light-emitting sublayer 223.

Each of the hole transport sublayer 222 contains the carrier transport organic compound and the cross-linkable organic compound containing a double bond group, an epoxy group, or a cyclic ether group as described in the first embodiment. Each of the light-emitting sublayer 223 contains the luminescent organic compound and the cross-linkable organic compound containing a double bond group, an epoxy group, or a cyclic ether group similar to the hole transport sublayer 222, as described in the first embodiment.

A process of producing the organic EL device 201 having the above-described structure will be described below. In this embodiment, the formation of the hole transport sublayer 222 is mainly described.

A liquid composition composed of the carrier transport organic compound and the cross-linkable organic compound containing a double bond group, an epoxy group, or a cyclic ether group as described in the first embodiment dissolved in an organic solvent is prepared in advance. The same organic solvent as in the first embodiment may be used.

The liquid composition is ejected by an ink-jet method on the anodes 221 surrounded by the bank 225 to form films 240.

After the formation of the films 240, a substrate 202 is placed in vacuum for about 30 minutes to dry the films 240.

The films 240 are irradiated with ultraviolet rays under atmospheric pressure for a predetermined period of time. The irradiation of the films 240 with ultraviolet rays results in the cross-linking reaction of the cross-linkable organic compound contained in the films 240. Cross-linked portions (altered portions 241) are not dissolved in an organic solvent.

Figure 14:
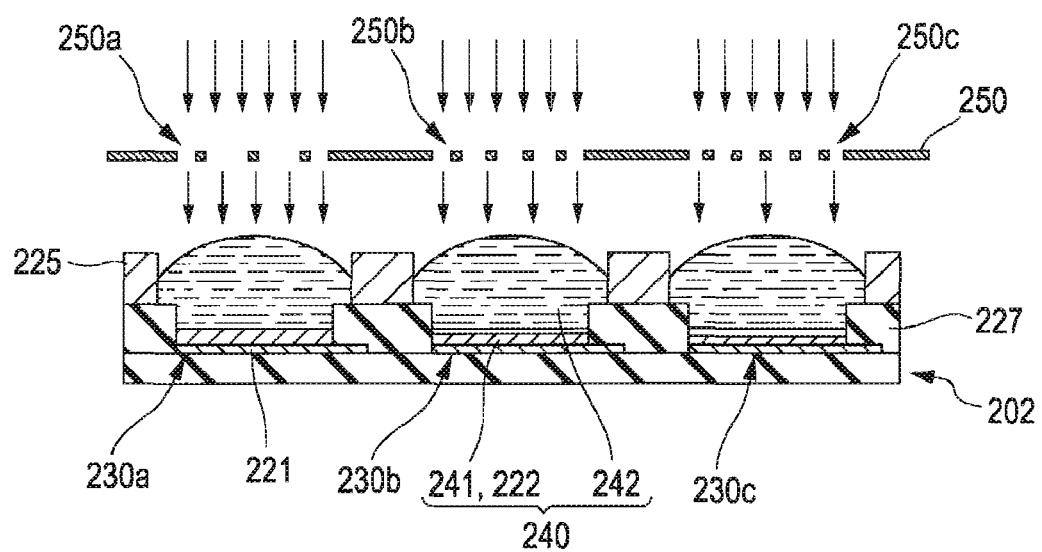
FIG. 14 is a process drawing illustrating the process of producing the organic EL device according to the second embodiment.

A photomask 250 having portions with different transmittances is used during ultraviolet irradiation. In the photomask 250, for example, a region 250a superposed on a left pixel 230a in FIG. 14 when viewed in plan has the highest transmittance. A region 250c superposed on a right pixel 230c in FIG. 14 when viewed in plan has the lowest transmittance. A region 250b superposed on a middle pixel 230b in FIG. 14 when viewed in plan has a transmittance lower than that of the region 250a and higher than that of the region 250c. Thus, the amount of ultraviolet rays with which the left pixel 230a is irradiated is the largest. The amount of ultraviolet rays with which the middle pixel 230b is irradiated is the second largest. The amount of ultraviolet rays with which the right pixel 230c is irradiated is the smallest.

When the films 240 are irradiated with ultraviolet rays in such a manner that the pixels are exposed to different amounts of ultraviolet irradiation, the altered portions 241 of the films 240 have different thicknesses. Specifically, the thickness of the altered portion 241 formed in the left pixel 230a exposed to the largest amount of ultraviolet irradiation is the largest. The thickness of the altered portion 241 formed in the middle pixel 230b exposed to the second largest amount of ultraviolet irradiation is the second largest. The thickness of the altered portion 241 formed in the right pixel 230c exposed to the smallest amount of ultraviolet irradiation is the smallest. That is, a larger amount of ultraviolet irradiation results in a larger thickness of the altered portion 241.

After the formation of the altered portions 241 of the films 240, unaltered portions 242 are removed. For example, a rinse liquid composed of an organic material such as toluene is dispensed on the substrate 202. The rinse liquid is extended on the entire surface of the substrate 202 by spin coating, thereby washing away the unaltered portions 242. Since the altered portions 241 of the films 240 are dissolved in an organic solvent, only the unaltered portions 242 are washed away. The altered portions 241 are left on the substrate 202. Then the surface of the substrate 202 is dried. The remaining altered portions 241 function as hole transport sublayers 222.

Next, the light-emitting sublayers 223 are formed at places each surrounded by bank 225. A liquid composition composed of the luminescent material dissolved in the organic solvent is prepared in advance. The liquid composition is ejected by an ink-jet method onto the hole transport sublayers 222 surrounded by the bank 225 to form films. The hole transport sublayers 222 are the altered portions 241 and thus are not dissolved in the organic solvent; hence, the organic solvent does not dissolve the hole transport sublayers 222. The formed films are irradiated with ultraviolet rays in the same way as in the formation of the hole transport sublayers 222. A portion of each film adjacent to a corresponding one of the hole transport sublayers 222, the portion having a predetermined thickness, undergoes a cross-linking reaction to form an altered portion that is not dissolved in an organic solvent. Then unaltered portion of each film is removed with an organic solvent such as toluene. The altered portions are not dissolved in the solvent such as toluene and are thus left. The remaining altered portions function as the light-emitting sublayers 223.

After the formation of the light-emitting sublayers 223, the cathode 224 is formed on the entirety of EL elements to organic EL layers 203. Furthermore, a resin seal and the protective layer (not shown) are formed in such a manner that the organic EL layers 203 are covered with the resin seal and the protective layer to complete the organic EL device 201.

According to this embodiment, each of the films to be formed into the hole transport sublayers 222 and the light-emitting sublayers 223 contains the cross-linkable organic compound containing at least one group selected from double bond groups, epoxy groups, and cyclic ether groups. The cross-linkable organic compound contained in the films is irradiated with ultraviolet rays so as to be cross-linked. Thus, the cross-linking reaction in the portions each having a predetermined thickness can be surely made. The adjustment of the intensity of ultraviolet irradiation and irradiation time can adjust thicknesses of cross-linked portions without cross-linking of the entirety of each film.

In particular, the photomask 250 having the portions with different ultraviolet transmittances is used when the cross-linkable organic compound is irradiated with ultraviolet rays. Thus, the thicknesses of the altered portions 241 can vary from pixel to pixel. For example, in the case where the organic EL device 201 emits light beams having different wavelengths (colors) such as red, green, and blue, thicknesses of the hole transport sublayers 222 and thicknesses of the light-emitting sublayers 223 can vary from color to color, thereby advantageously expanding the possibility of design of the organic EL device 201.

The embodiments of the invention have been described. The technical scope of the invention is not limited to the embodiments. Various changes may be made without departing from the scope of the invention.

For example, in the above-described embodiments, the organic EL devices are described. The invention is not limited to the organic EL devices. For example, the invention may be applied to organic transistors.

As materials of organic semiconductor layers constituting organic transistors, C60, C80, metal-containing fullerenes, and the like are suitably used. Examples of the metal-containing fullerenes include fullerenes such as fullerene encapsulating dysprosium (Dy) (referred to as "Dy@C82"). Furthermore, examples of the material of organic semiconductor layers constituting organic transistors include low-molecular-weight organic compounds, such as pentacene and oligothiophene; organic polymers such as polythiophene; metal complexes such as phthalocyanine; and carbon nanotubes.

A material of a voltage control layer for imparting ambipolar properties to the organic semiconductor layer is selected and used in response to the material of the organic semiconductor layer. Specifically, when the organic semiconductor layer is composed of fullerene, a silane compound is suitably used. Examples of the silane compound include silane compounds of the following general formula: $R^1(CH_2)_m SiR^2{}_n X_{3-n}$ (wherein m represents a natural number; and n represents one or two). In the silane compound represented by the general formula, when X represents a halogen atom, an alkoxy group, or the like, X is easy to be chemically adsorbed on a surface of an oxide, such as $SiO_2$ or $Al_2O_3$, suitably used as a gate insulating film to form a dense strong ultrathin film (monomolecular film). As a result, terminal group $R^1$ is located at a surface of the voltage control layer, thereby increasing a chemical affinity for the organic semiconductor layer composed of fullerene or the like. $R^2$ represents a hydrogen atom, an alkyl group such as a methyl group (—$CH_3$), or a derivative thereof.

In the voltage control layer, preferred examples of the silane compound capable of successfully imparting ambipolar properties to the organic semiconductor layer particularly composed of fullerene include silane compounds of the general formula, wherein $R^1$ represents a methyl group (—$CH_3$) or a trifluoromethyl group (—$CF_3$). The voltage control layer not only imparts ambipolar properties to the organic semiconductor layer but also controls the threshold voltage of an organic thin-film transistor. Specifically, the threshold-voltage properties of the organic semiconductor layer can be controlled by appropriately changing $R^1$.

In the above-described embodiments, the bottom-emission organic EL devices are exemplified. However, the invention is not limited thereto. The invention may also be applied to top-emission organic EL devices, in which light from light-emitting layer emerges from the side opposite a substrate. Furthermore, the invention may also be applied to devices such as solar cells having organic semiconductor layers as well as organic EL devices and organic transistors.

In the above-described embodiments, when the low-molecular-weight cross-linker having a double bond group, an epoxy group, or a cyclic ether group is used as the carrier transport organic compound contained in the hole transport sublayers 22, the cross-linker is cross-linked by heating or ultraviolet irradiation. However, the invention is not limited thereto. For example, cross-linking may be made by plasma irradiation or electron beam irradiation.

Example

An example of the organic EL device 1 according to the first embodiment will be described below.

Figure 7:
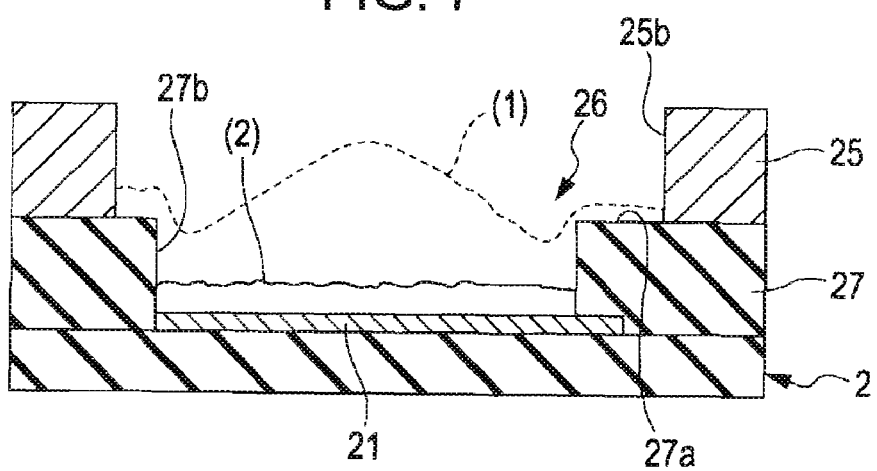
FIG. 7 shows a change in the thickness of a hole transport sublayer during the production process of the organic EL device.

FIG. 7 is a cross-sectional view of a pixel of the organic EL device 1 shown in FIG. 1. FIG. 7 shows the change of the surface of a hole transport sublayer formed by an ink-jet method.

Surface (1) shows the measurement result of the thickness of the film 40 immediately after the film 40 formed by an ink-jet method is heated to form the cured portion 41. Surface (2) shows the measurement result of the thickness of the remaining cured portion after an uncured portion of the film 40 indicated by Surface (1) is removed with a rinse liquid.

As is apparent from Surface (1), the thickness of the film 40 increases gradually from a side 25b of the bank 25 toward the middle portion of the opening 28. The film 40 has the maximum thickness at the middle portion of the opening 28. That is, the film 40 has a bulging area at the middle portion of the pixel. The result demonstrates that when the film 40 is formed by the ink-jet method and is then dried, the film 40 has the thickness distribution.

Surface (1) extends over the side surface 27b and top surface 27a of the insulating sublayer 27. That is, the film 40 is formed on the top surface 27a and the side surface 27b of the insulating sublayer 27. The result demonstrates that the film 40 has an integral structure in which a portion located on the anode 21 is connected to a portion located on the top surface 27a with a portion located on the side surface 27b.

In contrast, as is apparent from Surface (2), the film 40 is formed on the anode 21 and has a uniform thickness from the side surface 27b of the insulating sublayer 27 to the middle portion. The film 40 having a uniform thickness functions as the hole transport sublayer 22. Thus, the hole transport sublayer 22 has uniform current density distribution, thereby eliminating the non-uniformity of the emission of light in each pixel.

The result demonstrates that the film 40 is not formed on the top surface 27a and side surface 27b of the insulating sublayer 27. Only a portion formed on the anode 21 has hole transport properties. Thus, holes from the anode 21 are fed into only a region of the opening 26 of the insulating sublayer 27. Even when the light-emitting sublayer 23 is formed on the hole transport sublayer 22, a region outside a light-emitting region in each pixel does not emit light, thereby preventing a reduction in display accuracy.

What is claimed is:

1. A method for producing an organic semiconductor device including a plurality of organic semiconductor layers laminated on a substrate, the method comprising:

forming a film of a liquid composition on a target surface, the liquid composition being composed of a material constituting one of the plurality of the organic semiconductor layers, the material being dissolved or dispersed in a first solvent, and the target surface including a substrate surface and a surface of any of the other of the plurality of organic semiconductor layers;

altering a portion of the film adjacent to the target surface, the portion having a predetermined thickness, in such a manner that the portion is not dissolved in a predetermined solvent containing the first solvent; and removing an unaltered portion of the film with the predetermined solvent, the unaltered portion being not altered in the step of altering the portion.

2. The method for producing an organic semiconductor device according to claim 1, wherein an electrode electrically connected to the plurality of organic semiconductor layers is formed on a surface of the substrate, and the target surface is the surface of the electrode.

3. The method for producing an organic semiconductor device according to claim 2, wherein the electrode is mainly composed of a conductive metal oxide.

4. A method for producing an organic electroluminescent device including a substrate, a cathode, an anode, and a plurality of organic layers including an organic layer having hole transport properties and an organic layer having light-emitting properties, the plurality of organic layers being disposed between the cathode and the anode, the method comprising:

forming a film of a liquid composition on a target surface, the liquid composition being composed of a material constituting one of the plurality of the organic layers, the material being dissolved or dispersed in a first solvent, and the target surface including an anode surface and a surface of any of the other of the plurality of organic layers;

altering a portion of the film adjacent to the target surface, the portion having a predetermined thickness, in such a manner that the portion is not dissolved in a predetermined solvent containing the first solvent; and removing an unaltered portion of the film with the predetermined solvent, the unaltered portion being not altered in the step of altering the portion.

5. The method for producing an organic electroluminescent device according to claim 4, further comprising forming the second organic layer on the first organic layer after the removing of the unaltered portion of the film with the predetermined solvent.

6. The method for producing an organic electroluminescent device according to claim 5, wherein the forming of the second organic layer includes:

forming a second film of a liquid composition on the first organic layer, the liquid composition being composed of a material constituting the second organic layer, the material being dissolved or dispersed in the predetermined solvent;

altering a second portion of the second film adjacent to the first organic layer, the second portion having a predetermined thickness, in such a manner that the second portion is not dissolved in the predetermined solvent; and removing an unaltered portion of the second film with the predetermined solvent, the unaltered portion being not altered in the substep of altering the second portion.

7. The method for producing an organic electroluminescent device according to claim 6, wherein the second film includes a light-emitting organic compound; and a cross-linkable organic compound containing at least one group selected from double bond groups, epoxy groups, and cyclic ether groups, and in the substep of altering the second portion, the cross-linkable organic compound contained in the second film is cross-linked by heat treatment, ultraviolet irradiation, electron beam irradiation, or plasma irradiation.

8. The method for producing an organic electroluminescent device according to claim 5, wherein the anode is mainly composed of a conductive metal oxide.

9. The method for producing an organic electroluminescent device according to claim 5, wherein the first film includes a carrier transport organic compound and a cross-linkable organic compound composed of polysiloxane, and in the substep of altering the first portion, the cross-linkable organic compound contained in the first film is cross-linked by heat treatment.

10. The method for producing an organic electroluminescent device according to claim 5, wherein the first film includes a cross-linkable organic compound containing a silane coupling compound; and a carrier transport organic compound containing at least one selected from triphenylamine derivatives and polythiophene derivatives, and in the substep of altering the first portion, the cross-linkable organic compound contained in the first film is cross-linked by heat treatment.

11. The method for producing an organic electroluminescent device according to claim 5, wherein the first film includes a carrier transport organic compound; and a cross-linkable organic compound containing at least one group selected from double bond groups, epoxy groups, and cyclic ether groups, and in the substep of altering the first portion, the cross-linkable organic compound contained in the first film is cross-linked by heat treatment, ultraviolet irradiation, electron beam irradiation, or plasma irradiation.

* * * * *